(12) United States Patent
Saga

(10) Patent No.: US 6,533,000 B2
(45) Date of Patent: Mar. 18, 2003

(54) SUBSTRATE TRANSPORTATION CONTAINER

(75) Inventor: Koichiro Saga, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/832,196

(22) Filed: Apr. 11, 2001

(65) Prior Publication Data

US 2001/0053418 A1 Dec. 20, 2001

(30) Foreign Application Priority Data

Apr. 12, 2000 (JP) ........................................ 2000-110138

(51) Int. Cl.[7] .............................. B65B 1/04; B65B 3/04; B67C 3/02
(52) U.S. Cl. .............................. 141/98; 141/59; 141/63; 141/64; 141/65; 206/710
(58) Field of Search .............................. 141/4, 7, 8, 11, 141/63, 64, 59, 65, 69, 99, 113, 285, 98; 427/412.3; 206/710, 711; 414/217

(56) References Cited

U.S. PATENT DOCUMENTS 4,724,874 A * 2/1988 Parikh et al. .................. 141/98
5,611,452 A * 3/1997 Bonora et al. ............... 220/378
6,006,919 A * 12/1999 Betsuyaku .................. 206/454
6,077,894 A * 6/2000 Saito et al. .................. 524/220

FOREIGN PATENT DOCUMENTS

JP 411074337 A * 3/1999 ........... H01L/21/68

OTHER PUBLICATIONS

Shah et al., "Gas Permeability and Medical Fim Products", Sep. 1998, MPB Article Index, Medical Plastics and Biomaterials Magazine.*

* cited by examiner

Primary Examiner—Timothy L. Maust
(74) Attorney, Agent, or Firm—Rader, Fishman & Grauer PLLC; Ronald P. Kananen, Esq.

(57) ABSTRACT

A hermetic substrate transportation container permitting storage of an electronic substrate is provided, keeping a rise of internal moisture concentration low, thus preventing generation of natural oxidation film on the surface of the electronic substrate and allowing detection of the contents inside the substrate transportation container, from outside. A container body having an aperture for loading and unloading an electronic substrate, the substrate transportation container comprising a lid for sealing such aperture, in which the container body and the lid are made of a material having an amorphous polyolefin as its main constituent. By constituting the container body and the lid using the amorphous polyolefin with low hygroscopic characteristic as a main constituent, it is possible to keep discharge of moisture from the internal wall thereof low and also to prevent an increase of moisture concentration in the sealed compartment.

10 Claims, 2 Drawing Sheets

SUBSTRATE TRANSPORTATION CONTAINER

BACKGROUND OF THE INVENTION

1. Field of the Invention

The present invention relates to a substrate transportation container and, more specifically, to a hermetic substrate transportation container used for transportation of electronic substrates such as semi-conductor wafers or liquid crystal substrates.

2. Description of the Related Art

Conventionally, an electronic appliance using an electronic substrate, such as a semi-conductor wafer, a liquid crystal substrate or a magnetic disc, is fabricated in a clean room that is free of dust. However, transportation of the electronic substrate between processing apparatuses during fabrication is done by housing an electronic substrate into a cassette inside a portable and sealable clean container (in other words, a substrate transportation container). By means of that, the electronic substrate can be transported without being exposed to dust in the air, both inside and outside of the clean room. Such a substrate transportation container is commercialized under a trade name of SMIF (Standard Mechanical Interface) pod (a trademark of Assist Technologies, Inc.).

Although such SMIF pod has its interior sealed so as to prevent contamination by dust from the air, small molecules such as oxygen, water moisture or volatile organic substances can easily infiltrate. As a consequence, such small molecules infiltrated during transportation between processes contaminate the electronic substrate inside. For example, natural oxide film grows in the surface of the semi-conductor wafer and molecular adsorption contamination by an organic substance, boron, phosphor and the like is originated. For an advanced technology device, such contamination greatly affects the properties of the device.

In view of such problems, a flange is provided in borders of an aperture of the container's body and by sealing with an O-ring provided in a rim of a base lid to such flange, the sealing properties of the substrate transportation container's interior are improved. Japanese Patent Laid-Open No. 10-56050 discloses a substrate transportation container that limits infiltration of small molecules. Still, when transporting an electronic substrate that requires high cleanliness, like a semi-conductor wafer, the interior of the substrate transportation container containing the substrate is filled with an inert gas (hereinafter referred to simply as inert gas), such as argon (Ar) or nitrogen gas ($N_2$). At this event, replacement of the interior ambient atmosphere of the container with inert gas is done each time of the open-close of a bottom lid and, as a result, contamination of the electronic substrate by molecular adsorption of organic substances, boron or phosphor as well as formation of natural oxide film on the electronic substrate surface is prevented.

However, a substrate transportation container of the construction mentioned above is constructed using plastics material such as polycarbonate, for example. Because polycarbonate is a high hygroscopic material with a water absorption rate of 0.2%, water moisture is gradually ejected from the internal wall according to time course. As a result, the moisture concentration in the interior of the sealed substrate transportation container cannot be kept low for a long time, thus causing formation of natural oxide film in the surface of the electronic substrate placed inside.

In addition, although the container has to be cleaned up when the interior of the container is contaminated by fine particles, there is a problem that IPA (isopropanol), which is a washing liquid having electron-removing effect, cannot be employed, as IPA is corrosive to polycarbonate.

On the other hand, when constituting a substrate transportation container by means of metallic material with the purpose of controlling moisture discharge from the internal wall, the moisture concentration within the substrate transportation container can be kept low. However, it is hard to consider that a substrate transportation container made of metallic material is suitable for transportation because it is heavily. Furthermore, as the substrate transportation container made of metallic material is formed from a cutting process, productivity is low, and cost is high. Besides, there is the problem that an electronic substrate stored inside cannot be detected from outside, like through infrared radiation.

SUMMARY OF THE INVENTION

It is an object of the present invention to provide a substrate transportation container for sealing an electronic substrate by allowing long term conservation of low internal moisture concentration, thus reducing generation of natural oxide film on the electronic substrate surface and permitting recognition of the electronic substrate within the container under the sealed condition.

A substrate transportation container of the present invention achieving such purpose comprises a container body having an aperture for loading and unloading an electronic substrate, the substrate transportation container including a lid for sealing the aperture and at least one member selected from the container body and the lid is constituted mainly by an amorphous polyolefin.

In such substrate transportation container, the container body and the lid have a hygroscopic amorphous polyolefin of low moisture adsorption as a main constituent in its composition. As a result, water discharge from an internal wall of the container is reduced and an increase of moisture concentration within the sealed interior is reduced, even when the container is sealed for a long time. In addition, as the amorphous polyolefin has transparency, an electronic substrate placed inside can be detected, even when the container is sealed.

With such container body and such lid having the hygroscopic amorphous polyolefin of low moisture adsorption as a main constituent in its composition, the moisture discharge from the internal wall of the container is reduced and an increase of moisture concentration within the sealed interior is reduced, thus it is possible to reduce generation of natural oxide over a surface of the electronic substrate stored therein.

BRIEF DESCRIPTION OF THE DRAWINGS

The foregoing and other objects, features and advantages of the present invention will be apparent to those skilled in the art from the following description of the preferred exemplary embodiments of the present invention taken in conjunction with the accompanying drawings, in which.

DESCRIPTION OF THE PREFERRED EMBODIMENTS

Figure 1:
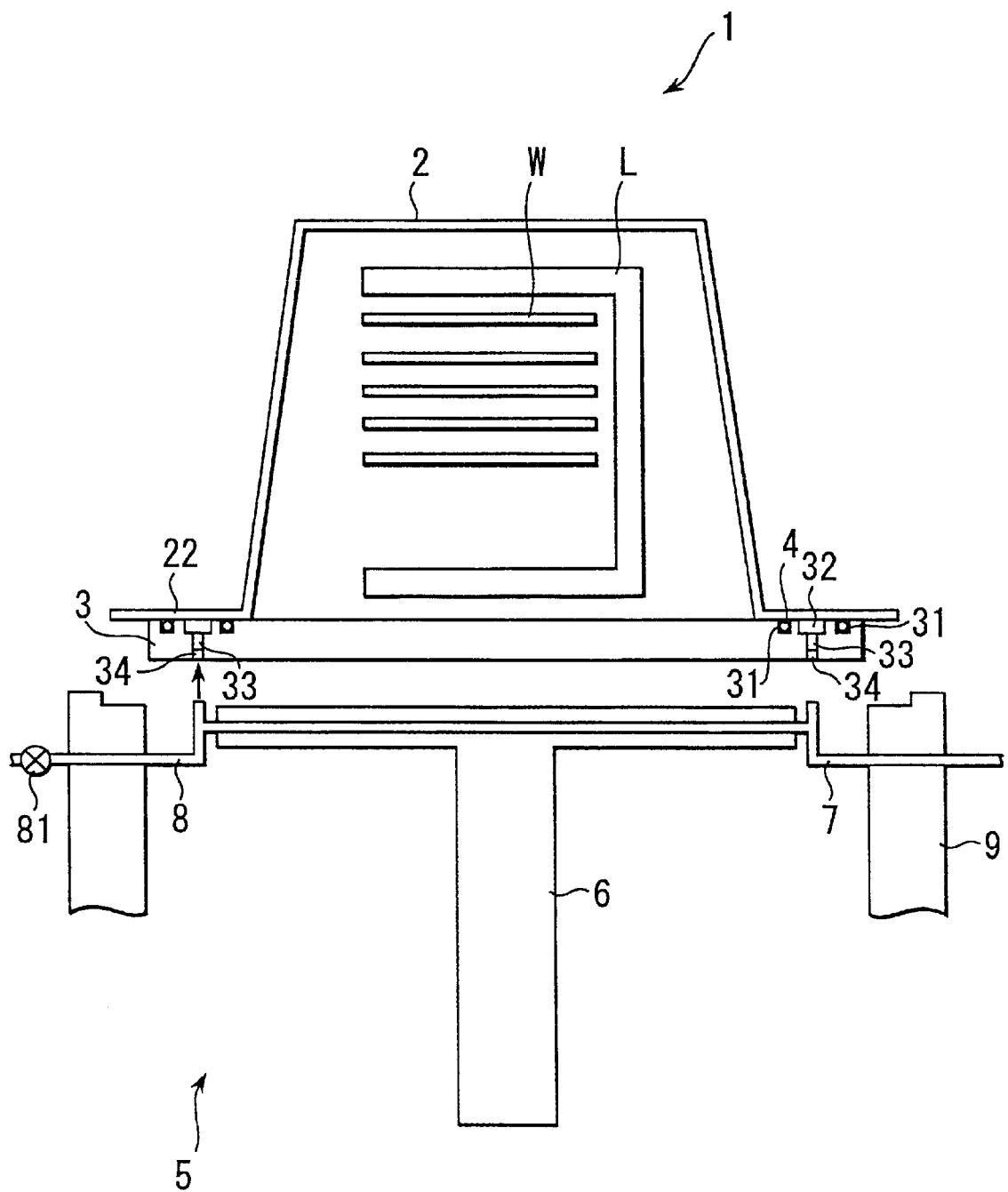
FIG. 1 is a diagrammatic view describing a substrate transportation container and a substrate housing method using the container, according to a preferred embodiment of the present invention.
Figure 2:
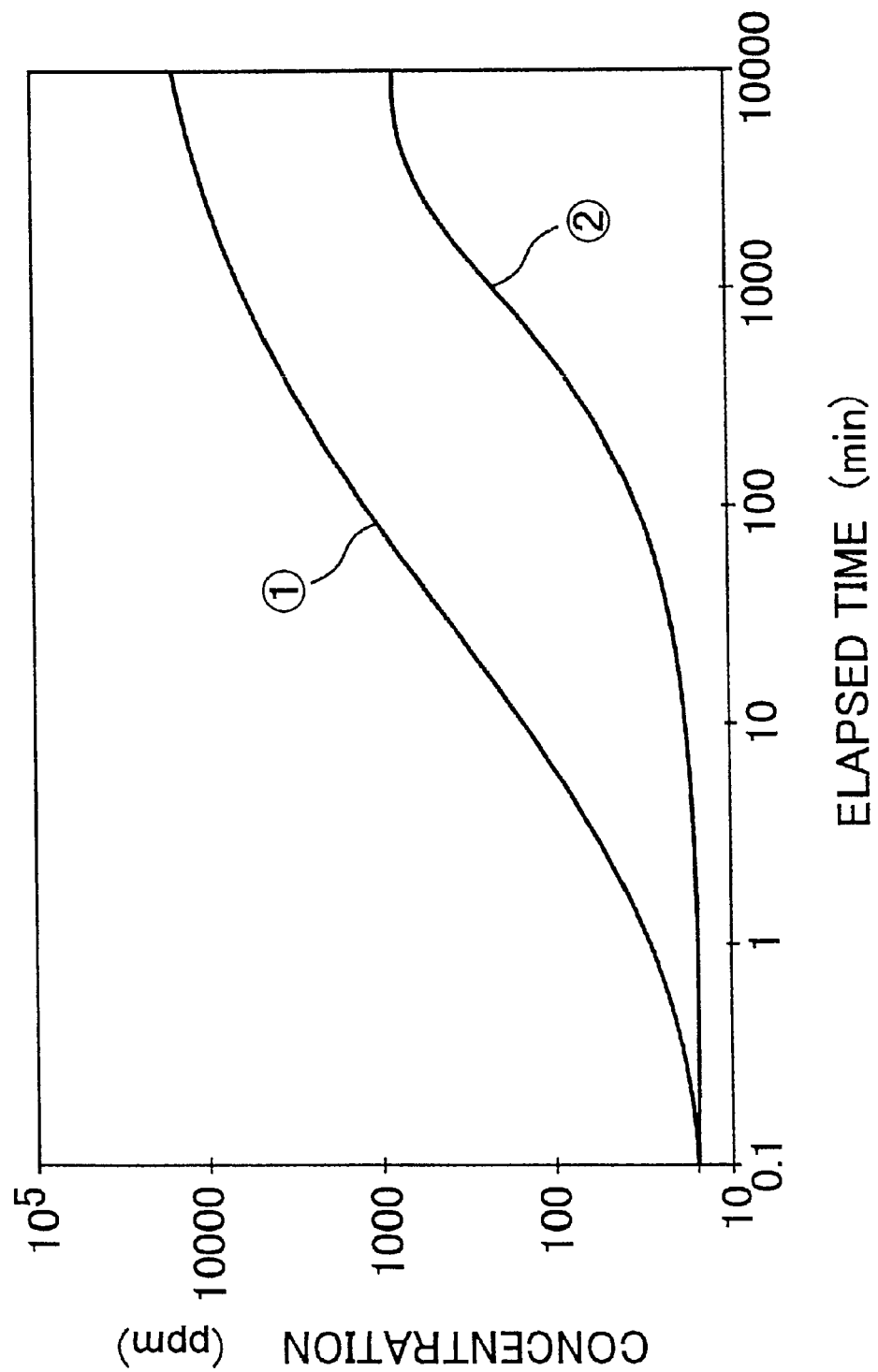
FIG. 2 is a graph showing a change in moisture concentration with time, inside the substrate transportation container according to the preferred embodiment of the present invention.

A substrate transportation container according to a preferred embodiment of the present invention is described based on FIG. 1 and FIG. 2.

FIG. 1 describes a construction of a substrate transportation container and a substrate storage method using the container, according to a preferred embodiment of the present invention.

A substrate transportation container 1 shown in FIG. 1 comprises a container body 2 for carrying an electronic substrate (for example, a semi-conductor wafer) W and a lid 3.

The container body 2 has a size sufficient for containing a carrier L holding a plurality of the electronic substrate W, and an aperture 21 on its bottom side for loading and unloading the carrier L. In addition, a rim of the aperture 21 is constituted as a flange 22 bent outwardly and extending throughout the rim.

The lid 3 has a size enough for blocking the aperture 21 of the container body 2 so that the rim portion is abutted against the flange 22 of the lid 3, when blocking the aperture 21 of the container body 2. In such lid 3, a double O-ring groove 31 is formed extending along the rim of the lid 3 in the rim portion abutted to the flange 22, with the aperture 21 of the container body 2 blocked. Then, an O-ring 4 is provided inside such O-ring groove 31.

Moreover, in a position as interposed within the double O-ring groove 31, a vacuum groove 32 extending along the rim of the lid 3 is provided so as to have partial communication (not shown in the figure) to the O-ring groove 31. In addition, two pipe tubes 33, 33 are provided on the lid 3 so as to connect an external environment to the vacuum groove 32, when blocking the aperture 21 of the container body 2. Then, a valve 34 is provided for the pipe tubes 33, 33.

A composition of matter having an amorphous polyolefin as its main constituent constitutes the container body 2 and the lid 3.

The amorphous polyolefin is, generally, a cyclic olefin resin having a saturated hydrocarbon ring structure in its polymer's main chain or sidechain, or a ring-opened polymer or a hydride of the ring-opened polymer, of a monomer having a single unsaturated bond among monomers having a monocyclic cycloolefin, a norbomene ring or the like.

As the monocyclic cycloolefin, there is, for example, cyclobutene, 1-methylcyclopentene, 3-methylcyclobutene, 3,4-diisopropenylcyclobutene, cyclopentene, 3-methylcyclopentene, cyclohexene, cyclooctene, 1-methylcyclooctene, 5-methylcyclooctene, cyclooctatetraene, cyclododecen and the like.

In addition, as the monomer having a single unsaturated bond among monomers having the norbornene ring, there is, for example, 2-methyl-bicyclo[2.2.1]hepta-2-ene, 2,2-dimethyl-bicyclo[2.2.1]hepta-2-ene,2-ethyl-bicyclo[2.2.1] hepta-2-ene, 2-butyl-bicyclo[2.2.1]hepta-2-ene, 2-hexyl-bicyclo[2.2.1]hepta-2-ene, 2-phenyl-bicyclo[2.2.1]hepta-2-ene, 2-octyl-bicyclo[2.2.1]hepta-2-ene, 2-octadecyl-bicyclo [2.2.1]hepta-2-ene.

A construction of a substrate carrying apparatus 5 used for housing the electronic substrate W in the substrate transportation container 1 of such construction is described below.

Such substrate carrying apparatus 5 is provided together with the processing apparatus not shown in the figures, and comprises a lift 6 moving up and down when carrying the lid 3 of the substrate transportation container 1. A gas introduction pipe 7 and an air exhaust pipe 8, connected to the pipe tubes 33, 33 of the lid 3 loaded on the lift 6, are fixed to the lift 6, and a pump 81 is provided for the air exhaust pipe 8.

In addition, such lift 6 is arranged within a housing 9 having a top aperture larger than the lid 3. Such housing 9 is constituted so as to support a most external contour portion of the flange 22 of the container body 2 with its upper end under the condition of having the substrate transportation container 1 loaded on the lift 6, and to have its top aperture blocked by means of the container body 2. In addition, although illustration has been omitted, the housing 9 has communication to an electronic substrate introduction chamber of a processing apparatus, and has an air exhaust pipe and an inert gas introduction pipe provided.

Next, description is made of a procedure for housing the electronic substrate W in the substrate transportation container 1 by means of using the substrate carrying apparatus 5.

After finishing process at the processing apparatus, the electronic substrate W housed within the cassette L on the lid 3 is loaded on the lift 6. In such condition, the gas introduction pipe 7 and the air exhaust pipe 8 are connected to the pipe tube 33, 33 of the lid 3. In addition, the container body 2 is carried on the housing 9 of the substrate carrying apparatus 5, with the flange 22 supported on the upper end of the housing 9.

Firstly, after an internal portion of the container body 2 and the housing 9 are filled with inert gas or after the internal portion thereof is depressurized, the lift 6 loaded with the electronic substrate W is raised. As a result, the cassette L is housed into the container body 2 kept under inert gas atmosphere or depressurized, whereby the O-ring groove 31 of the lid 3 and the vacuum groove 32 are blocked by means of the flange 22 of the container body 2.

Next, the valve 34 of the pipe tube 33 of the lid 3, connected to the air exhaust pipe 8 is opened, and then the pump 81 provided for the air exhaust pipe 8 is activated. As a result, the gas in the vacuum groove 32 communicating to the pipe tube 33 and in the O-ring groove 31 gas is exhausted whereby depressurizing, thus making the lid 3 vacuum-adsorbed against the container body 2, as well as sealing the container body 2 by pushing the O-ring 4 under pressure against the flange 22. Then, the pump 81 is stopped and the valve 34 of the pipe tube 33 is closed, thus the electronic substrate W within the substrate transportation container 1 is kept sealed under an inert gas atmosphere (or, under a depressurized atmosphere).

Moreover, the substrate transportation container 1 in which the electronic substrate W is stored sealed is separated from the substrate carrying apparatus 5. At this event, if the housing 9 is depressurized, the adherence of the substrate transportation container 1 to the housing 9 is released by means of returning the housing 9 to an environment atmospheric pressure. Afterwards, the substrate transportation container 1 is conveyed to a subsequent step.

Furthermore, a procedure for unloading the sealed electronic substrate W from the substrate transportation container 1 is done as follows. Firstly, the substrate transportation container 1 is loaded on the lift 6 of the substrate transportation apparatus 5 provided for the processing apparatus of the subsequent process. At this event, the pipe tubes 33, 33 of the lid 3 are connected to the gas introduction pipe 7 and the air exhaust pipe 8. Then, the valve 34 of the pipe tube 33 connected to the gas introduction pipe 7 is opened, the inert gas is introduced to the pipe tube 33 from the gas introduction pipe 7, whereby the inert gas is supplied to the vacuum groove 32 communicated to the pipe tube 33 and the O-ring groove 31. Then, the interior of the vacuum groove 32 and the O-ring groove 31 are pressurized, thus releasing the status of adherence of the lid 3 to the flange 22 of container body 2.

After the above, the lift 6 of the substrate transportation apparatus 5 is descended. As a result, with the container body 2 supported on the upper end of the housing 9, the lid 3 descends into the housing 9 along with the lift 6, so that the electronic substrate W is carried out from within the container body 2 to the housing 9.

The substrate transportation container 1 used as discussed above has the container body 2 and the lid 3 constituted mainly by an amorphous polyolefin of low hygroscopic property, so that it allows a moisture discharge on its internal wall to be controlled to a small amount. Therefore, even if sealed for a long time, an increase of moisture concentration within the sealed interior can be controlled, thus preventing formation of natural oxidation film on the surface of the electronic substrate stored sealed inside. As a result, for a product (a semiconductor device, for example) formed by means of the electronic substrate stored sealed in such substrate transportation container 1, a quality of the product such as electrical properties can be preserved, and yield of the process can be improved.

Furthermore, an anamorphous polyolefin has transparency such that even if the substrate transportation container 1 is sealed, it is possible to detect from the outside the electronic substrate W stored inside. In addition, in contrast to a substrate transportation container made of polycarbonate, the substrate transportation container 1 constituted by an amorphous substance polyolefin does not suffer corrosion by IPA. As a result, when the substrate transportation container 1 is contaminated by fine particles, it is possible to provide a cleaning process making use of IPA, which has electron-removing effect.

Besides, the substrate transportation container 1 having resin material as its main constituent has lighter weight and better formability in comparison with the case of a substrate transportation container using metallic material. As a result, the substrate transportation container 1 can be transported easily, the productivity becomes high and the fabrication cost becomes cheaper compared with a conventional substrate transportation container.

Furthermore, FIG. 2 is a graph showing a change in moisture concentration with, time inside the sealed substrate transportation container according to the preferred embodiment of the present invention. Measurement was done for the substrate transportation container having an amorphous substance polyolefin as its main constituent according to the preferred embodiment of the invention, and a conventional substrate transportation container having polycarbonate as its main constituent. After the atmosphere of the interior of the substrate transportation container body is substituted by nitrogen gas until moisture concentration is reduced to approximately 10 ppm and then sealed, a change with time of moisture concentration was measured. The water absorption rate for the amorphous polyolefin is approximately 0.01%, while for the polycarbonate, the water absorption rate is approximately 0.2%.

As shown in the graph, when compared with the moisture concentration ① for a conventional substrate transportation container (made of polycarbonate), an increase of moisture concentration ② for the substrate transportation container of the preferred embodiment of the invention (made of an amorphous polyolefin-based material) is controlled low, thus confirming a smaller moisture discharge from the container's internal wall in the later case of the preferred embodiment of the invention as compared to the former conventional case.

Finally, the configurations and structures of respective units and portions described specifically with respect to the preferred embodiments of the present invention are only examples of realization of the present invention, so the embodiments thereof should not be construed as to limiting the technical scope of the present invention.

What is claimed is:

1. A substrate transportation container, comprising:
  a container body for loading and unloading an electronic substrate, the container body having a bottom portion with a bottom edge extending peripherally thereabout defining an aperture into the container body and a flange connected to and extending outwardly from the bottom portion;
  a lid having a sealing portion for sealing said aperture and a rim portion surrounding the sealing portion and sized for face-to-face contact with the flange, the rim portion formed with at least one continuous O-ring groove and a continuous vacuum groove therein, the at least one O-ring groove and the vacuum groove being in fluid communication with each other; and
  at least one O-ring disposed in the at least one O-ring groove; wherein,
    upon sealing the container body with the lid, the flange covers the at least one continuous O-ring groove and the continuous vacuum groove and contacts the at least one O-ring and
    a composition of said container body and/or said lid comprises an amorphous polyolefin.

2. A container, comprising:
  a container body carrying an electronic substrate, the container body having a bottom portion with a bottom edge extending peripherally thereabout defining an aperture into the container body and a flange connected to and extending outwardly from the bottom portion; and
  a lid sealing said container body and having a sealing portion for sealing said aperture and a rim portion surrounding the sealing portion and sized for face-to-face contact with the flange, the rim portion formed with at least one continuous O-ring groove and a continuous vacuum groove therein, the at least one O-ring groove and the vacuum groove being in fluid communication with each other; and
  at least one O-ring disposed in the at least one O-ring groove; wherein,
    upon sealing the container body with the lid, the flange covers the at least one continuous O-ring groove and the continuous vacuum groove and contacts the at least one O-ring and
    a composition of at least one of said container body and said lid comprises an amorphous polyolefin.

3. The container according to claim 2, wherein said container body is sealed by means of said lid attached to said container body.

4. A container according to any one of claims 1 and 2, wherein the amorphous polyolefin has a low moisture absorption rate.

5. A container according to claim 4, wherein the low moisture absorption rate is approximately 0.01%.

6. A container according to claim 5, wherein the amorphous polyolefin is, generally, a cyclic olefin resin having a saturated hydrocarbon ring structure in its polymer main chain or side-chain, or a ring-opened polymer or a hydride of the ring-opened polymer, of a monomer having a single unsaturated bond selected from a group of monomers having a monocyclic cycloolefin or a norbornene ring.

7. A container according to claim 6, wherein the monocyclic cycloolefin is cyclobutene, 1-methylcyclopentene, 3-methylcyclobutene, 3,4-diisopropenylcyclobutene, cyclopentene, 3-methylcyclopentene, cyclohexene, cyclooctene, 1-methylcyclooctene, 5-methylcyclooctene, cyclooctatetraene and cyclododecen.

8. A container according to claim 6, wherein the monomer has a single unsaturated bond among monomers having the norbornene ring being 2-methyl-bicyclo[2.2.1]hepta-2-ene, 2,2-dimethyl-bicyclo[2.2.1]hepta-2-ene, 2-ethyl-bicyclo[2.2.1]hepta-2-ene, 2-butyl-bicyclo[2.2.1]hepta-2-ene, 2-hexyl-bicyclo[2.2.1]hepta-2-ene, 2-phenyl-bicyclo[2.2.1]hepta-2-ene, 2-octyl-bicyclo[2.2.1]hepta-2-ene, 2-octadecyl-bicyclo[2.2.1]hepta-2-ene.

9. A container according to claims 1 or 2, wherein the lid includes at least one pipe tube extending therethrough and in communication with the vacuum groove.

10. A container according to claim 9, further comprising at least one valve operably connected to the at least one pipe tube.

* * * * *